United States Patent [19]
Vermeersch et al.

[11] Patent Number: 4,970,133
[45] Date of Patent: Nov. 13, 1990

[54] PRESENSITIZED IMAGING ELEMENT SUITABLE FOR USE AS A LITHOGRAPHIC PRINTING PLATE WITH SINGLE HYDROPHILIC LAYER WHICH INCLUDES A LIGHT-SENSITIVE DIAZONIUM SALT AND TETRAALKYL ORTHOSILICATE CROSS-LINKING AGENT

[75] Inventors: Joan T. Vermeersch, Deinze; Paul J. Coppens, Turnhout, both of Belgium

[73] Assignee: Agfa-Gevaert, N.V., Mortsel, Belgium

[21] Appl. No.: 256,970

[22] Filed: Oct. 13, 1988

[30] Foreign Application Priority Data

Oct. 27, 1987 [EP] European Pat. Off. ........ 87202056.5

[51] Int. Cl.$^5$ ..................... G03F 7/016; G03F 7/021; G03C 1/60; G03C 1/61
[52] U.S. Cl. .................................. 430/175; 430/176; 430/177; 430/157; 430/204; 430/302
[58] Field of Search ................ 430/175, 176, 177, 157

[56] References Cited

U.S. PATENT DOCUMENTS

| | | | |
|---|---|---|---|
| 3,159,487 | 12/1964 | Kreiger et al. | 430/176 |
| 3,228,769 | 1/1966 | Workman | 430/176 |
| 3,419,394 | 12/1968 | Bach | 430/176 |
| 3,733,200 | 5/1973 | Takaishi et al. | 430/176 |
| 3,778,270 | 12/1973 | Roos | 430/176 |
| 3,971,660 | 7/1976 | Stachle | 430/302 |
| 4,275,137 | 6/1981 | Verhoof | 430/176 |
| 4,284,705 | 8/1981 | Phlipot et al. | 430/159 |
| 4,495,269 | 1/1985 | Bialczak et al. | 430/176 |

Primary Examiner—Charles L. Bowers, Jr.
Attorney, Agent, or Firm—A. W. Breiner

[57] ABSTRACT

Presensitized imaging element comprising a support and a light-sensitive hyrophilic layer thereon, said light-sensitive hydrophilic layer containing in homogeneously distributed state throughout the entire layer a hydrophilic (co)polymer or (co)polymer mixture, a tetraalkyl orthosilicate crosslinking agent in an amount of at least 0.2 parts by weight per part by weight of hydrophilic (co)polymer or (co)polymer mixture and a low-molecular weight diazonium salt and preferably also (a) substance(s) that increase(s) the mechanical strength and the porosity of the layer, by means of which a lithographic printing plate can be produced by imagewise exposing said imaging element to an ultraviolet radiation source, subsequently bringing it in the presence of an aqueous liquid in contact with a receptor element comprising a receiving layer containing a polyionic mordant for the diazonium salt and separating it from the receiving layer to leave the residual non-exposed diazonium salt on the receiving layer.

10 Claims, No Drawings

PRESENSITIZED IMAGING ELEMENT SUITABLE FOR USE AS A LITHOGRAPHIC PRINTING PLATE WITH SINGLE HYDROPHILIC LAYER WHICH INCLUDES A LIGHT-SENSITIVE DIAZONIUM SALT AND TETRAALKYL ORTHOSILICATE CROSS-LINKING AGENT

The present invention relates to a presensitized imaging element and to a method for making a lithographic printing plate by means of said imaging element.

Lithography is the process of printing from specially prepared surfaces, some areas of which are capable of accepting lithographic ink, whereas other areas, when moistened with water, will not accept the ink. The areas which accept ink form the printing image areas and the ink-rejecting areas form the background areas.

In the art of photolithography, a photographic material is made imagewise receptive to oily or greasy inks in the photo-exposed (negative-working) or in the non-exposed areas (positive-working) on a hydrophilic background.

In the production of common lithographic printing plates, also called surface litho plates or planographic printing plates, a support that has affinity to water or obtains such affinity by chemical treatment is coated with a thin layer of a photosensitive composition. Coatings for that purpose include light-sensitive polymer layers containing diazo compounds, dichromate-sensitized hydrophilic colloids and a large variety of synthetic photopolymers.

Particularly diazo-sensitized systems are widely used. These systems have been extensively reviewed by Kosar J. in "Light-Sensitive Systems", Wiley, New York, 1965, Chapter 7.

A generally used negative-working diazo-sensitized system is based on the capability of diazo compounds to harden a polymer when exposed to ultraviolet and blue radiation. Diazo compounds which have been used for the preparation of lithographic printing plates based on their hardening properties are e.g. diazonium salts whose photolysis products can harden polymers (natural colloids or synthetic resins) directly and diazonium polymers. Although polymers containing diazonium groups have a large structure they remain water soluble owing to the presence of the ionic diazonium groups. When these groups are destroyed by exposure to light an insoluble resin is formed. Particularly useful diazonium polymers are the condensation products of a carbonyl compound, e.g. an aldehyde, such as formaldehyde, with a diazonium salt of e.g. a p-aminodiphenylamine. These condensation products are usually designated diazo resins. In these systems a polymeric binder is optionally added to the diazo resin coating.

In general a support, if not hydrophilic by itself, is first coated with a hydrophilic layer to form the hydrophilic background of the printing plate and a top layer containing the diazo compound is then applied (see, for example, DE-P-1900469, DE-P-2030634 and U.S. Pat. No. 3,971,660). Said material has a double-layer system, so that its preparation is complicated, with a consequent unavoidable high cost.

It is known to use as hydrophilic layer in said systems a layer containing polyvinyl alcohol and hydrolyzed tetraethyl orthosilicate and preferably also silicium dioxide and/or titanium dioxide as described in e.g. GB-P-1419512, FR-P-2300354, U.S. Pat. Nos. 3,971,660 and 4,284,705. This hydrophilic layer is overcoated with a light-sensitive layer containing a diazonium salt or a diazo resin in a polymeric binder.

After imagewise exposure the light-sensitive coating has to be developed to obtain oleophilic image areas and hydrophilic non-image areas. Usually this proceeds by dissolving the non-exposed areas in either an organic solvent or an aqueous alkaline solvent depending on the nature of the polymeric binder, thereby revealing the hydrophilic surface beneath. Only the light-hardened areas which are ink-receptive remain on top of the hydrophilic surface.

From an ecological point of view an aqueous development is preferred. This implies that the polymeric binder has to be water soluble (e.g. polyvinyl alcohol) and that contact with water before exposure needs to be avoided. This may cause some practical difficulties e.g. in handling the unexposed element.

It is an object of the present invention to provide a novel single-layer diazo-sensitized imaging element.

It is another object of the present invention to provide a very simple, ecologically more acceptable processing method to obtain a lithographic printing plate by using said single-layer diazo-sensitized imaging element.

Other objects will become apparent from the description hereinafter.

According to the present invention a presensitized imaging element suitable for making a lithographic printing plate is provided, said imaging element comprising a support and a light-sensitive hydrophilic layer thereon, said light-sensitive hydrophilic layer containing in homogeneously distributed state throughout the entire layer a hydrophilic (co)polymer or (co)polymer mixture, a tetraalkyl orthosilicate crosslinking agent in an amount of at least 0.2 parts by weight per part by weight of hydrophilic (co)polymer or (co)polymer mixture and a low-molecular weight diazonium salt and preferably also (a) substance(s) that increase(s) the mechanical strength and the porosity of the layer.

As hydrophilic (co)polymers one may use, for example, homopolymers and copolymers of vinyl alcohol, acrylamide, methylol acrylamide, methylol methacrylamide, acrylic acid, methacrylic acid, hydroxyethyl acrylate, hydroxyethyl methacrylate or maleic anhydride/vinylmethylether copolymers. The hydrophilicity of the (co)polymer or (co)polymer mixture used is the same as or higher than the hydrophilicity of polyvinyl acetate hydrolyzed to at least an extent of 60 percent by weight, preferably 80 percent by weight.

Examples of tetraalkyl orthosilicate crosslinking agents for use in the present invention are hydrolyzed tetraethyl orthosilicate and hydrolyzed tetramethyl orthosilicate.

Examples of low-molecular weight diazonium salt for use in the present invention include: benzidine tetrazoniumchloride, 3,3'-dimethylbenzidine tetrazoniumchloride, 3,3'-dimethoxybenzidine tetrazoniumchloride, 4,4'-diaminodiphenylamine tetrazoniumchloride, 3,3'-diethylbenzidine tetrazoniumsulfate, 4-aminodiphenylamine diazoniumsulfate, 4-aminodiphenylamine diazoniumchloride, 4-piperidino aniline diazoniumsulfate, 4-diethylamino aniline diazoniumsulfate and oligomeric condensation products of diazodiphenylamine and formaldehyde.

The hydrophilic layer in the presensitized imaging element of the present invention may also contain substances that increase the mechanical strength and the porosity of the layer. For this purpose colloidal silica may be used. The colloidal silica employed may be in the form of any commercially available water-dispersion of colloidal silica for example having an average particle size up to 40 nm, e.g. 20 nm. In addition inert particles of larger size than the colloidal silica can be added e.g. silica prepared according to Stöber as described in J. Colloid and Interface Sci., Vol. 26, 1968, pages 62 to 69 or alumina particles or particles having an average diameter of at least 100 nm which are particles of titanium dioxide or other heavy metal oxides. By incorporating these particles the surface of the layer is given a uniform rough texture consisting of microscopic hills and valleys, which serve as storage places for water in background areas.

The amount of tetraalkyl orthosilicate crosslinking agent is at least 0.2 parts by weight per part by weight of hydrophilic (co)polymer, preferably between 0.5 and 2 parts by weight, preferably 1 part by weight.

The amounts of the other components in the hydrophilic layer of the imaging element of the present invention is not very critical and may be varied provided the physical characteristics and shelf life of the layer are not drastically impaired.

The thickness of the light-sensitive hydrophilic layer in the material of this invention may vary in the range of 0.1 to 10 μm and is preferably 0.5 to 3 μm.

The coating composition of the invention is coated using any conventional coating method.

According to a particularly advantageous embodiment an aqueous solution of the low-molecular weight diazonium salt is added to an aqueous mixture containing a dispersion of colloidal silica and/or titanium dioxide, an emulsion of hydrolyzed tetramethyl orthosilicate and an aqueous polyvinyl alcohol solution and coated on a support.

Various supports may be used for the lithographic coating of this invention provided it has been treated to provide a surface to which the light-sensitive hydrophilic layer can be applied and adheres. Examples of such supports are photographic film bases e.g. substrated polyethylene terephthalate film, cellulose acetate film, plastics having a metal layer or deposit thereon, a metal support, e.g. aluminium and polyolefin (e.g. polyethylene) coated paper, the polyolefin surface of which may have been subjected to a corona discharge to improve the adherence of the lithographic coating.

The exposure of the imaging element used in the present invention advantageously proceeds with ultraviolet light optionally in combination with blue light in the wavelength range of 250 to 500 nm. Useful exposure sources are high or medium pressure halogen mercury vapour lamps, e.g. of 1000 W.

Since most lithography is done by the offset process, the imaging element is exposed in such a way that the image obtained thereon is right reading. The exposure may be an exposure using optics or a contact exposure.

The diazonium salts are converted upon exposure from hydrophilic to hydrophobic (due to the destruction of the ionic diazonium groups) and additionally the photolysis products of the diazonium salts may induce an advancement in the level of crosslinking of the polymeric binder, thereby selectively converting the surface, in an image pattern, from hydrophilic to hydrophobic. The unexposed areas remain unchanged, i.e. hydrophilic.

No further processing or development is required to effect this differential hydrophilic-hydrophobic characteristic.

When mounted on a printing press the printing plate is first washed with an aqueous fountain solution. To prevent this fountain solution from being contaminated by residual non-exposed diazonium salts which are generally water soluble, the unexposed diazonium salts should be removed from the printing plate before mounting it on a printing press. However, in case diffusion-resistant diazonium salts are used this removal is not necessary.

This removal can be effected by bringing the imaging element in the presence of an aqueous liquid in contact with a receptor element. This receptor element generally comprises a support and an image-receiving layer containing gelatin and an polyionic mordant for the diazonium salt. The unexposed diazonium salts when moistened diffuse from the imaging element to the receptor element where they are mordanted by the polyion. Examples of mordants for use in the receptor element of the present invention are polystyrene sulfonic acid sodium salt, polyacrylic acid sodium salt, dextrane sulfate and a quaternated condensation product of N-ethyldiethanolamine/isoforon methane with diethyl sulfate and epichlorohydrine.

According to the present invention a method of forming a lithographic printing plate is provided, comprising the steps of (a) imagewise exposing a presensitized imaging element comprising a support and a light-sensitive hydrophilic layer thereon, said light-sensitive hydrophilic layer containing in homogeneously distributed state throughout the entire layer a hydrophilic (co)polymer or (co)polymer mixture, a tetraalkyl orthosilicate crosslinking agent in an amount of at least 0.2 parts by weight per part by weight of hydrophilic (co)polymer or (co)polymer mixture and a low-molecular weight diazonium salt and preferably also (a) substance(s) that increase(s) the mechanical strength and the porosity of the layer, (b) bringing the imaging element in the presence of an aqueous liquid in contact with a receptor element comprising a receiving layer containing a plyionic mordant for the diazonium salt and (c) separating the imaging element from the receiving layer thereby leaving the residual non-exposed diazonium salt on the receiving layer.

The lithographic printing plates obtained according to the present invention need not be inked immediately; they may be stored for weeks before being inked without deleterious effects on the printing properties.

The obtained lithographic printing plate yields on an offset printer several thousands of good-quality copies.

The following examples illustrate the present invention.

EXAMPLE 1

To a solution of 600 mg of Brentamine Fast Blue B Salt (sold by Imperial Chemical Industries) corresponding to the following formula

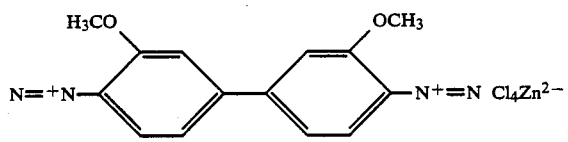

in 38 ml of deionized water the following ingredients were subsequently added: 10 g of a 5% solution of an acrylamide/methylol acrylamide copolymer in water, 4 g of a hydrolyzed 5% tetraethyl orthosilicate emulsion in water and 13 g of propanol.

This solution was coated onto anodized aluminium (by doctor blade coating technique) at a temperature of 50° C. and further dried for 20 hours at 50° C. under vacuum atmosphere.

The imaging element was exposed through a film mask representing a negative of the image to be printed. In the exposure a high pressure halogen mercury vapour lamp was used providing an ultraviolet radiation dose of 0.6 mW/cm$^2$.

Subsequently the imaging element was developed while in contact with a receptor element consisting of a polyester support and an image-receiving layer comprising per m$^2$: gelatin (2.4 g), polystyrene sulfonic acid sodium salt (2.4 g) and formaldehyde (0.02 g) in a COPYPROOF T 42 diffusion transfer processing apparatus (COPYPROOF is a registered trademark of Agfa-Gevaert Belgium) containing deionized water. The imaging element was separated from the receptor element and UV spectroscopy revealed that the unexposed diazonium compounds had been transferred from the imaging element to the receptor element.

A lithographic plate was thus obtained that when placed on a lithographic printing press using conventional fountain solution and oleophilic lithographic inks yielded a printing run of more than 20000 copies of good quality.

EXAMPLE 2

To a solution of 250 mg of Brentamine Fast Blue B Salt in 2 ml of water the following ingredients were subsequently added: 2.5 ml of a 5% solution of an acrylamide/methylol acrylamide copolymer in water and 2.5 ml of a hydrolyzed 5% tetraethyl orthosilicate emulsion in water.

This solution was coated on a substrated polyester support (2 μm dry thickness) at 40° C. and further dried at 50° C. for 20 hours under vacuum atmosphere.

The obtained imaging element was exposed and processed as above.

EXAMPLE 3

To a solution of 100 mg of Brentamine Fast Blue B Salt in 5 ml of deionized water the following ingredients were added: 2.5 ml of a 5% solution of an acrylamide/methylol acrylamide copolymer in water and 2.5 ml of a hydrolyzed 5% tetraethyl orthosilicate emulsion in water.

This solution was coated onto a polyethylene coated paper (dry thickness 2 μm) at a temperature of 35° C. and further dried at 50° C. for 20 hours.

This imaging element was exposed and processed as described in example 1.

EXAMPLE 4

To 130 g of a 50 wt % TiO$_2$(average particle size 0.3 to 0.5 μm) dispersion in deionized water were subsequently added: 270 ml of water, 560 g of a 5 wt % polyvinyl alcohol solution in water and 600 g of a hydrolyzed 5% tetramethyl orthosilicate emulsion in water. This mixture was stirred while slowly adding a solution of 7 g of 4-diazodiphenylamine sulfate in 1730 ml of demineralized water.

After mixing, the resulting dispersion was coated onto a polyester (coated with a hydrophilic adhesion layer) support and dried under vacuum atmosphere for 20 hours at 50° C.

The imaging element was exposed through a mask to a high pressure halogen mercury vapour lamp of 1000 W at a distance of 70 cm for 10 minutes.

Subsequently the imaging layer was developed while in contact with a receptor layer consisting of 2.4 g of gelatin, 2.4 g of polystyrene sulfonic acid sodium salt and 0.02 g of formaldehyde per m$^2$ coated onto polyester film. This processing was carried out in a modified COPYPROOF T 42 diffusion transfer processing apparatus containing deionized water. The time inbetween the contact with water and contact with the receptor layer must be very short.

After separating the imaging element from the receptor element the former was placed onto a lithographic printing press using fountain solution and oleophilic lithographic inks and yielded a printing run of several ten thousands of copies of very good quality.

EXAMPLE 5

To 26 g of a 25 wt % colloidal SiO$_2$ (average particle size 0.3 to 0.5 μm) dispersion in deionized water were subsequently added: 140 ml of water, 560 g of a 5 wt % polyvinyl alcohol solution in water and 600 g of a hydrolyzed 5% tetramethyl orthosilicate emulsion in water. This mixture was stirred while slowly adding a solution of 7 g of 4-diazodiphenylamine sulfate in 1730 ml of demineralized water.

After mixing, the resulting dispersion was coated onto a polyester (coated with a hydrophilic adhesion layer) support and dried under vacuum atmosphere for 20 hours at 50° C.

The imaging element was exposed through a mask to a high pressure halogen mercury vapor lamp of 1000 W at a distance of 70 cm for 5 minutes.

Subsequently the imaging layer was developed while in contact with a receptor layer consisting of 2.4 g of gelatin, 2.4 g of a quaternated condensation product of N-ethyldiethanolamine/isoforon diisocyanate/4,4'-diisocyanodiphenyl methane with diethyl sulfate and epichlorohydrine and 0.02 g of formaldehyde per m$^2$ coated onto polyester film. This processing was carried out in a COPYPROOF T 42 diffusion transfer processing apparatus containing deionized water.

After separating the imaging element from the receptor element the former was placed onto a lithographic printing press using conventional fountain solution and oleophilic lithographic inks and yielded a printing run of several ten thousands of copies of very good quality.

EXAMPLE 6

4.6 g of an oligomeric condensation product between 4-diazodiphenylamine sulfate and formaldehyde was dissolved in 230 ml of water and slowly added to a mixture of 92 ml of a 5 wt % solution of polyvinyl alcohol in water and 100 ml of a hydrolyzed 5% tetramethyl orthosilicate emulsion in water.

The solution was coated onto an aluminium support and dried for 20 hours at 50° C.

This imaging element was exposed and processed as described in example 1.

We claim:

1. Presensitized imaging element comprising a support and a light-sensitive hydrophilic layer thereon as single outermost layer, said light-sensitive hydrophilic layer containing in homogeneously distributed state throughout the entire layer a hydrophilic (co)polymer or (co)polymer mixture, a tetraalkyl orthosilicate crosslinking agent in an amount of at least 0.2 parts by weight per part by weight of hydrophilic (co)polymer or (co)polymer mixture and a low-molecular weight diazonium salt as light-sensitive ingredient in an amount sufficient so as to convert the surface of the outermost layer, after imagewise exposure, into hydrophobic ink-receptive image areas and hydrophilic ink-rejecting background areas.

2. Presensitized imaging element according to claim 1, wherein the hydrophilic (co)polymer or (co)polymer mixture has a hydrophilicity which is the same as or higher than the hydrophilicity of polyvinyl acetate hydrolyzed to at least an extent of 60 percent by weight.

3. Presensitized imaging element according to claim 1, wherein the hydrophilic (co)polymer is polyvinyl alcohol or polyhydroxyethyl acrylate or polyacryl amide.

4. Presensitized imaging element according to claim 1 wherein the tetraalkyl orthosilicate crosslinking agent is hydrolyzed tetraethyl orthosilicate or hydrolyzed tetramethyl orthosilicate.

5. Presensitized imaging element according to claim 1 wherein the amount of tetraalkyl orthosilicate crosslinking agent is between 0.5 and 2 parts by weight per part by weight of hydrophilic (co)polymer or (co)polymer mixture.

6. Presensitized imaging element according to claim 5, wherein the amount of tetraalkyl orthosilicate crosslinking agent is one part by weight per part by weight of hydrophilic (co)polymer or (co)polymer mixture.

7. Presensitized imaging element according to claim 1 wherein the low-molecular weight diazonium salt is a benzene diazonium salt or an oligomeric condensation product of a carbonyl compound and a diazonium salt.

8. Presensitized imaging element according to claim 1 wherein the light-sensitive hydrophilic layer also contains (a) substance(s) that increase(s) the mechanical strength and the porosity of the layer.

9. Presensitized imaging element according to claim 8, wherein the substance(s) that increases the mechanical strength and the porosity of the layer is(are) colloidal silica and/or particles of titanium dioxide or other heavy metal oxide.

10. Presensitized imaging element according to claim 1 wherein the support has been treated to provide a surface to which the light-sensitive hydrophilic layer can be applied and adheres.

* * * * *